United States Patent [19]

Hermann

[11] 4,044,269

[45] Aug. 23, 1977

[54] CIRCUIT ARRANGEMENT FOR A REPETITION-BLOCKING DEVICE

[76] Inventor: Eduard Hermann, Weilimdorfer Strasse 7, Korntal-Munchingen, Germany

[21] Appl. No.: 658,453

[22] Filed: Feb. 17, 1976

[30] Foreign Application Priority Data

Feb. 24, 1975 Germany .............................. 2507807

[51] Int. Cl.$^2$ ............................................. H02J 4/00
[52] U.S. Cl. ..................................... 307/149; 222/26; 222/32
[58] Field of Search ....................... 307/96, 97, 98, 99, 307/149; 235/92 FL; 222/26, 25, 27, 28, 32, 33, 34, 35, 36, 14; 194/3, 13

[56] References Cited

U.S. PATENT DOCUMENTS

| | | | |
|---|---|---|---|
| 3,033,421 | 5/1962 | Henderson | 222/26 |
| 3,498,501 | 3/1970 | Robbins et al. | 222/26 |
| 3,913,069 | 10/1975 | Rundin et al. | 340/147 LP |
| 3,951,307 | 4/1976 | Muller et al. | 235/92 FL |

Primary Examiner—Robert K. Schaefer
Assistant Examiner—Morris Ginsburg

Attorney, Agent, or Firm—McGlew and Tuttle

[57] ABSTRACT

The circuit arrangement includes a transformer having a primary side included in at least one phase conductor of a polyphase supply for the load. A control circuit is connected to the secondary side of the transformer and includes a threshold circuit receiving a control signal from the transformer, a memory circuit receiving a threshold signal from the threshold circuit, a bistable switch connected to the threshold circuit and the memory circuit and switched, by the threshold signal, to a position preventing the stored signal from being passed on from said memory circuit, and a controlled electronic switch inserted in the phase conductor and controlled and opened by the stored signal. A resetting switch is operable to reset the control circuit to the initial state, and a delay device may be interposed between the memory circuit and the controlled electronic switch to delay opening of the latter until after a subsequent operation of the repetition-blocking device. The resetting switch controls a further switch, connected between the transformer and the threshold circuit, the memory circuit and the bistable switch.

4 Claims, 2 Drawing Figures

CIRCUIT ARRANGEMENT FOR A REPETITION-BLOCKING DEVICE

FIELD AND BACKGROUND OF THE INVENTION

The present invention relates to a circuit arrangement for a repetition-blocking device for preventing prohibited or undesired repetition of operations. This problem arises in a great number of technical fields. In chemistry, for example, it may be necessary during mixing processes not to permit the repeated addition of a given substance until another substance has been added.

Another field of application is the prevention of prohibited repetition of operations. As a well-known example, there may be cited self-service filling pumps. Here, misapplication is possible by illicitly reusing the filling pump after the first refueling operation and after the delivery of the voucher, unless this is prevented by automatic blocking devices. To avoid such misuse, a blocking circuit has been provided in self-service filling pumps, which is released upon replacement of the hose nozzle and can be unblocked again only by a special measure, e.g. by operating a switch at the cashier's desk. To this end, it is necessary to lay a special control line from the control desk, which is located in the filling-station building and also contains the indicatorlamps, to the filling pump. Since, in general, this has to be done on installed filling pumps, this entails considerable expense. To simplify this problem, a solution has been proposed wherein one of the three phase conductors of the three-phase system of the fuel pump is used as the control line. Via this control line a commercially available switching relay is controlled by means of which the individual switching stages are unblocked or blocked in the manner of a Geneva stop. It has turned out, however, that such control devices are highly susceptible to trouble, particularly since the coils of the switching relays are constantly subjected to a high voltage. A consequence of this susceptibility to trouble is unreliable operation. For example, no defined unblocked or blocked position is obtained, quite apart from the dependence of the electromechanical relays on vibrations and the like.

SUMMARY OF THE INVENTION

It is the object of the present invention to provide a repetition-blocking device for preventing prohibited or undesired repetition of operations, particularly for preventing the prohibited repetition of refueling at self-service filling pumps, which does not have the above disadvantages.

The fundamental idea of the invention is to use, in a manner known per se, one of the three phases for the control of the repetition-blocking device. According to the invention, however, the phase is not directly included in the control, but a control signal is derived indirectly, during the operation, by inserting into the respective phase conductor the primary winding or side of a transformer whose secondary side is connected to the control circuit. The control circuit includes a threshold circuit to which, the secondary voltage of the transformer is applied, and which when an adjustable threshold voltage is exceeded — this can be detected by means of a zener diode, for example, provides a signal to a memory circuit. A switch, controlled by the threshold signal, too, prevents any output from the memory circuit as long as the operation is going on. After the memory circuit has been enabled, it provides a control signal to a controlled electronic switch inserted in the phase conductor, which signal changes this switch to the blocking state. This blocking state can be unblocked, in known manner, only by a measure from the control desk. Advantageously, the control line includes a circuit which prevents the threshold circuit from responding after the operation has been completed. This would be possible if, at the end of the first operation, a second operation were initiated before the switch inserted in the phase conductor is opened.

In some applications, e.g. in the case of self-service filling pumps, it is necessary to permit the first operation to be followed by a second before the repetition-blocking device may become effective. In the case of self-service filling pumps, a voucher must be printed after the refueling. Since the voucher printer consumes much less energy than is required during refueling, the circuit may be so designed that, during voucher printing, the secondary current does not suffice to restart the control circuit. In this case, it is sufficient to provide a delay circuit which causes the blocking signal not to reach the switch inserted in the phase conductor until the printing operation has been completed.

The invention has the advantage of eliminating the need for a special control line from the control center to the implement, e.g. to the filling pump. Another advantage lies in the fact that no high voltages are used in the control circuit. Furthermore, the control circuit can be realized in a very small space, and reliability is much better than in conventional control circuits.

BRIEF DESCRIPTION OF THE DRAWINGS

The invention will now be explained in more detail and by way of example with reference to the accompanying drawings, in which.

DESCRIPTION OF THE PREFERRED EMBODIMENT

Figure 1:
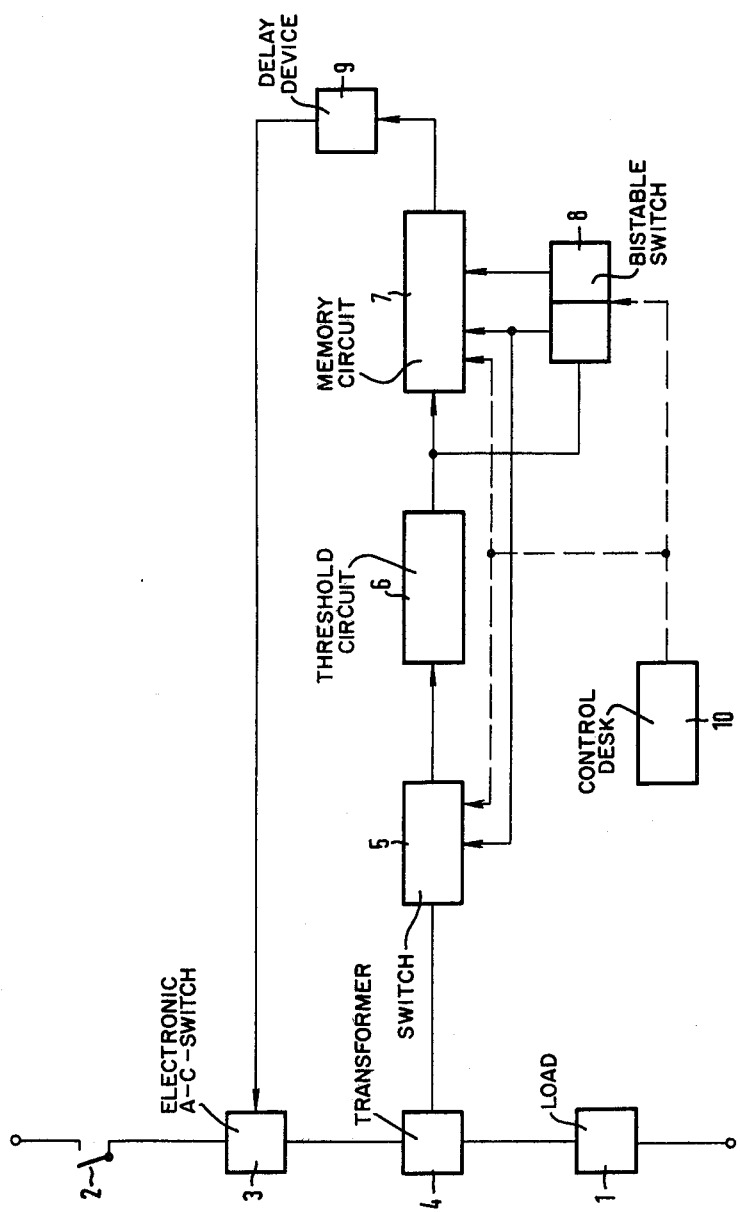
FIG. 1 is a schematic diagram of the novel circuit arrangement.

The block diagram of FIG. 1 shows all parts of a repetition-blocking device which are essential to the invention; the repetition-blocking device is largely independent of the device to be blocked. Designated by 1 is the load which can be connected to the power supply by means of a switch 2. Inserted in the phase conductor R, for example, is a controlled electronic alternating-current switch 3 and a transformer 4. The switch 3 is closed in the initial state, On the secondary side of the transformer 4, a voltage is generated whose magnitude is dependent on the current flowing on the primary side, and which serves as the control voltage, as will be explained in the following.

The control voltage is applied through a closed switch 5 to a threshold circuit 6 which, when a predetermined voltage threshold is exceeded, provides a signal to a memory circuit 7. The state of the memory circuit 7 thus indicates whether an operation is in progress or has been completed.

Simultaneously with the storing of the threshold signal, a bistable switch 8 is changed to its second state, and its output signal inhibits the memory circuit 7 from passing on the signal stored in it to the controlled electronic switch 3. When the operation has been completed, i.e., when the switch 2 is opened, it must be insured that the switch 3 is opened and kept open until the memory circuit 7 is enabled again by an independent signal. When the switch 2 is opened, the control voltage will drop below the threshold value, so the switch 8 will return to its initial state. As a result, the inhibit signal is removed from the memory circuit 7, and the stored signal is fed as the control signal to the switch 3, which is opened. Thus, a repetition of the operation has been blocked.

According to the circuit design and the components used, the switch 5 may be provided, which is opened via the switch 8 when the operation has been finished. This will be explained in more detail below with the aid of FIG. 2.

The delay device 9 may be of advantage if blocking is not to be effected until after two operations, and if the delay time of the delay device 9 suffices to carry out the second operation. This is the case with self-service filling pumps, for example. After the hose nozzle has been replaced, whereby the fuel-pump motor is switched off, the voucher-printer motor is started. Only after the printing and delivery of the voucher must the filling pump be stopped. During this delay time, no new filling operation can be initiated as the switch 5 is open, whereby the repetition-blocking device becomes effective automatically. The repetition-blocking device can only be unblocked by a special signal which is sent from the control desk 10 to the switches 5 and 8, and to memory circuit 7, to return them to their initial state, so the switch 3 will be closed again.

Figure 2:
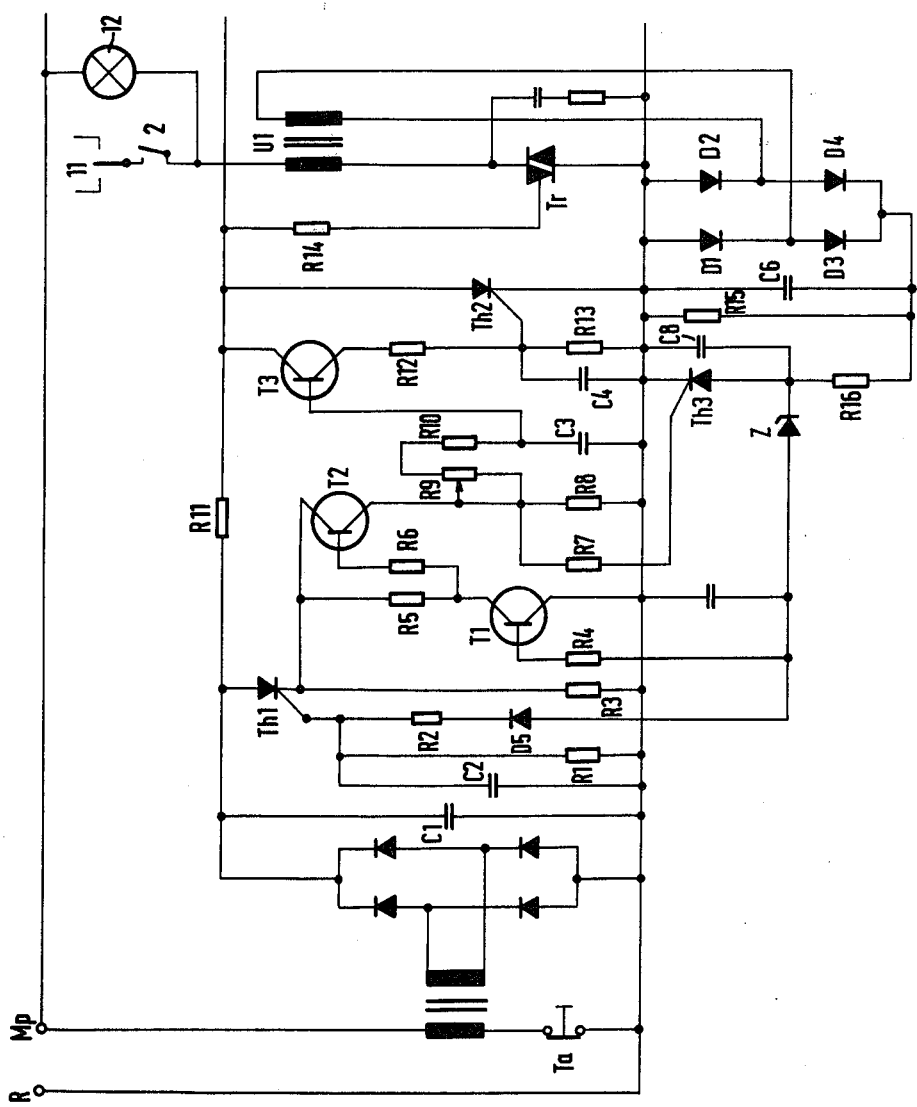
FIG. 2 shows an embodiment of the invention as a repetition-blocking device at a self-service filling pump.

FIG. 2 shows a detailed example of a circuit for a repetition-blocking device according to the invention for use with a self-service filling pump. In this example, it is assumed that the control voltage is derived from the phase R. The switch 11 is to indicate that it is possible to switch the load 1 between fuel pump and voucher printer.

In the initial state, the switch 3 (FIG. 1) is closed, and the indicator lamp 12 indicates that the filling pump is ready for operation. The function of the switch 3 is performed by the triac Tr. This triac conducts, because the gate electrode is supplied with current through the resistors R11 and R14 which are connected to the output of rectifier bridge connected to the secondary side of the supply voltage transformer inserted in phase conductor R. The thyristors Th1, Th2, and Th3 are cut off, because no control voltage is applied thereto. When the switch 2 is closed by means of the hose nozzle, the pump motor will thus be started. As soon as a load current flows through the primary side of the transformer U1 inserted in the phase conductor R, a voltage dependent on the magnitude of the flowing current is induced on the secondary side. This voltage is rectified by means of the rectifier bridge constituted by diodes D1 to D4. The capacitor C6 serves to smooth the rectified voltage. The resistor R15 serves to discharge the capacitor C6 when the load is disconnected. The capacitor C8 is charged through the resistor R16. As soon as the breakdown voltage of the zener diode Z has been reached, the zener diode begins to conduct, so a current will flow through the diode D5 and the resistor R2 to the gate electrode of the thyistor Th1 and switch the latter on. The positive potential at the anode of Th1 then also prevails at the upper end of the resistor R3 and is retained when the control current decreases, and the current flowing through R3 is so high that the holding current of the thyristor Th1 is reached. The resistor R1 and the capacitor C2 serve to divert undesired interference pulses.

Parallel to the drive of the thyristor Th1, the base of the transistor Th1 is driven into the conducting state, whereby the potential applied to the collector of this transistor through the resistor R5 becomes negative. Since, however, the transistor T2 must be driven with a positive potential, it is cut off. Thus, the signal stored by the thyristor Th1 cannot reach the thyristor Th2.

Inserted between the thyristors Th1 and Th2 is a delay circuit, whose operation will be explained below.

At the end of the refueling operation, the load current decreases and the rectified secondary voltage of the transformer U1 drops below the breakdown voltage of the zener diode Z. As a result of the zener diode being cut off, the transistor T1 is switched into the non-conducting state. Thus, a positive potential is applied to the base of the transistor T2 through resistors R5 and R6, so that T2 will turn on. However, before the signal stored by the thyristor Th1 reaches the gate electrode of the thyristor Th2 via resistors R9, R10, the transistor T3, and resistor R12, the thyristor Th3 receives control current through the resistor R2, so that thyristors Th3 will turn on when a gate potential is applied thereto. Thus, if the load should be restarted immediately, voltage is prevented from reaching the thyristor Th1 via the zener diode Z, which then would be caused to conduct again. To keep the thyristor Th3 in the conducting state, the small load current of an indicator lamp, which is always present, is sufficient.

When the stored signal is applied from the thyristor Th1 to the gate electrode of the thyristor Th2, the latter is switched on. Thus, the potential between the resistors R11 and R14 becomes zero, and so does the control signal at the triac Tr, thus turning it off. Once fired, the thyristor Th2 can return to the blocking state only if the holding current is not sufficient to keep the thyristor conducting, i.e. when its anode potential becomes zero. This is accomplished by opening the push-button switch Ta for a short time, whereby the thyristors Th1 and Th2 return to the blocking state, too. Thus, the repetition-blocking device is again ready for operation.

As mentioned previously, it is advantageous or necessary in some applications to delay the switching-off of the triac Tr. This is done with a delay circuit of FIG. 2 corresponding to delay device 9 of FIG. 1, which is described in the following.

The positive potential at the resistor R8 causes a current to flow through the resistors R9 and R10, so the capacitor C3 is charged with a time constant determined by resistors R9, R10, and C3. As soon as the forward voltage of the base-emitter path of the transistor T3 is exceeded, the transistor T3 begins to conduct and transmits positive potential through the resistor R12 to the gate electrode of the thyristor Th2, so the latter is switched on and has zero potential at its anode, whereby the triac Tr is switched off.

While a specific embodiment of the invention has been shown and described in detail to illustrate the application of the principles of the invention, it will be understood that the invention may be embodied otherwise without departing from such principles.

What is claimed is:

1. In a repetition-blocking device for preventing prohibited or undesired operations involving a load supplied with polyphase power, particularly for preventing the prohibited repetition of the taking of fuel from self-service fuel pumps, an improved circuit arrangement comprising, circuit means including a transformer having a primary side included in at least one phase conductor of the polyphase supply, and having a secondary side providing a control signal; a control circuit connected to said secondary side and including a threshold circuit receiving the control signal, a memory circuit connected to said threshold circuit to receive a threshold signal therefrom, a bistable switch connected to said threshold circuit and said memory circuit and switched by the threshold signal to a position preventing the stored signal from being passed on from said memory circuit, and a controlled electronic switch inserted in said at least one phase conductor and controlled and opened by the stored signal responsive to interruption of the control signal supplied from said transformer secondary side; and a resetting switch connected to said control circuit and selectively operable to reset said control circuit to the initial state.

2. An improved circuit arrangement, as claimed in claim 1, wherein said circuit means includes a further switch in said control circuit connected between the secondary side of said transformer and said threshold circuit, and connected to said bistable switch; said further switch being opened by said bistable switch upon termination of the operation.

3. An improved circuit arrangement, as claimed in claim 1, wherein said circuit means includes a delay circuit connected between said memory circuit and said controlled electronic switch.

4. An improved circuit arrangement, as claimed in claim 1, wherein said circuit means includes a further switch connected between the secondary side of said transformer and said threshold circuit, and connected to said bistable switch, said bistable switch opening said further switch responsive to termination of the operation; said control circuit including a triac constituting said controlled electronic switch, a third thyristor constituting said further switch, a Zener diode constituting said threshold circuit, a first thyristor included in said memory circuit, and a first transistor and a second transistor constituting said bistable switch; a rectifier bridge having its input side connected to the secondary side of said transformer; a capacitor connected across the output side of said rectifier bridge; said Zener diode having one terminal connected to the ouput side of said rectifier bridge and its opposite terminal connected to the gate electrode of said first thyristor and to the base of said first transistor; said first transistor having its collector connected to the base of said second transistor; means connecting the cathode of said first thyristor to the collector of said second transistor; control potential means connected to said at least one phase conductor of the polyphase supply and applying a control potential between the anode and cathode of said first thyristor; said second transistor having its base current cut off by said first transistor when said Zener diode is in the conducting state; a second thyristor; means connecting the gate electrode of said second thyristor to the cathode of said first thyristor through said second transistor; means connecting the anode of said second thyristor to the anode of first thyristor; means connecting the cathode of said second thyristor to the input end of said triac; and means connecting the gate electrode of said triac to the anode of said first thyristor.

* * * * *